(12) United States Patent
Steegen et al.

(10) Patent No.: US 7,429,752 B2
(45) Date of Patent: Sep. 30, 2008

(54) METHOD AND STRUCTURE FOR FORMING STRAINED SI FOR CMOS DEVICES

(75) Inventors: An L Steegen, Stamford, CT (US); Haining S. Yang, Wappingers Falls, NY (US); Ying Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/534,526

(22) Filed: Sep. 22, 2006

(65) Prior Publication Data

US 2007/0020806 A1 Jan. 25, 2007

Related U.S. Application Data

(63) Continuation of application No. 10/605,906, filed on Nov. 5, 2003, now Pat. No. 7,129,126.

(51) Int. Cl.
*H01L 29/772* (2006.01)

(52) U.S. Cl. .................. 257/65; 257/288; 257/622; 257/E29.084

(58) Field of Classification Search ............ 257/65, 257/E29.084
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,241,197 A | 8/1993 | Murakami et al. | |
| 5,310,446 A | 5/1994 | Konishi et al. | |

(Continued)

FOREIGN PATENT DOCUMENTS

FR 2 838 237 10/2003

(Continued)

OTHER PUBLICATIONS

G. Zhang, et al., "A New 'Mixed-Mode' Reliability Degradation Mechanism in Advanced Si and SiGe Bipolar Transistors," IEEE Transactions on Electron Devices, vol. 49, No. 12, Dec. 2002, pp. 2151-2156.

(Continued)

*Primary Examiner*—Stephen W Smoot
(74) *Attorney, Agent, or Firm*—Joseph P. Abate; Greenblum & Bernstein P.L.C.

(57) ABSTRACT

A semiconductor device includes a semiconductor substrate having at least one gap, extending under a portion of the semiconductor substrate. A gate stack is on the semiconductor substrate. A strain layer is formed in at least a portion of the at least one gap. The strain layer is formed only under at least one of a source region and a drain region of the semiconductor device.

14 Claims, 7 Drawing Sheets

U.S. PATENT DOCUMENTS

| | | | |
|---|---|---|---|
| 5,354,695 A | 10/1994 | Leedy |
| 5,371,399 A | 12/1994 | Burroughes et al. |
| 5,391,510 A | 2/1995 | Hsu et al. |
| 5,459,346 A | 10/1995 | Asakawa et al. |
| 5,471,948 A | 12/1995 | Burroughes et al. |
| 5,557,122 A | 9/1996 | Shrivastava et al. |
| 5,561,302 A | 10/1996 | Candelaria |
| 5,565,697 A | 10/1996 | Asakawa et al. |
| 5,571,741 A | 11/1996 | Leedy |
| 5,592,007 A | 1/1997 | Leedy |
| 5,592,018 A | 1/1997 | Leedy |
| 5,670,798 A | 9/1997 | Schetzina |
| 5,679,965 A | 10/1997 | Schetzina |
| 5,683,934 A | 11/1997 | Candelaria |
| 5,840,593 A | 11/1998 | Leedy |
| 5,861,651 A | 1/1999 | Brasen et al. |
| 5,880,040 A | 3/1999 | Sun et al. |
| 5,940,736 A | 8/1999 | Brady et al. |
| 5,946,559 A | 8/1999 | Leedy |
| 5,960,297 A | 9/1999 | Saki |
| 5,989,978 A | 11/1999 | Peidous |
| 6,008,126 A | 12/1999 | Leedy |
| 6,025,280 A | 2/2000 | Brady et al. |
| 6,046,464 A | 4/2000 | Schetzina |
| 6,066,545 A | 5/2000 | Doshi et al. |
| 6,090,684 A | 7/2000 | Ishitsuka et al. |
| 6,107,143 A | 8/2000 | Park et al. |
| 6,117,722 A | 9/2000 | Wuu et al. |
| 6,133,071 A | 10/2000 | Nagai |
| 6,165,383 A | 12/2000 | Chou |
| 6,221,735 B1 | 4/2001 | Manley et al. |
| 6,228,694 B1 | 5/2001 | Doyle et al. |
| 6,246,095 B1 | 6/2001 | Brady et al. |
| 6,255,169 B1 | 7/2001 | Li et al. |
| 6,261,964 B1 | 7/2001 | Wu et al. |
| 6,265,317 B1 | 7/2001 | Chiu et al. |
| 6,274,444 B1 | 8/2001 | Wang |
| 6,281,532 B1 | 8/2001 | Doyle et al. |
| 6,284,623 B1 | 9/2001 | Zhang et al. |
| 6,284,626 B1 | 9/2001 | Kim |
| 6,319,794 B1 | 11/2001 | Akatsu et al. |
| 6,361,885 B1 | 3/2002 | Chou |
| 6,362,082 B1 | 3/2002 | Doyle et al. |
| 6,368,931 B1 | 4/2002 | Kuhn et al. |
| 6,403,486 B1 | 6/2002 | Lou |
| 6,403,975 B1 | 6/2002 | Brunner et al. |
| 6,406,973 B1 | 6/2002 | Lee |
| 6,423,615 B1 | 7/2002 | Ravi et al. |
| 6,461,936 B1 | 10/2002 | von Ehrenwall |
| 6,476,462 B2 | 11/2002 | Shimizu et al. |
| 6,483,171 B1 | 11/2002 | Forbes et al. |
| 6,493,497 B1 | 12/2002 | Ramdani et al. |
| 6,498,358 B1 | 12/2002 | Lach et al. |
| 6,501,121 B1 | 12/2002 | Yu et al. |
| 6,506,652 B2 | 1/2003 | Jan et al. |
| 6,509,618 B2 | 1/2003 | Jan et al. |
| 6,521,964 B1 | 2/2003 | Jan et al. |
| 6,531,369 B1 | 3/2003 | Ozkan et al. |
| 6,531,740 B2 | 3/2003 | Bosco et al. |
| 6,703,293 B2 | 3/2004 | Tweet et al. |
| 6,703,648 B1 * | 3/2004 | Xiang et al. ............... 257/192 |
| 6,717,216 B1 | 4/2004 | Doris et al. |
| 6,787,423 B1 | 9/2004 | Xiang |
| 6,825,086 B2 | 11/2004 | Lee et al. |
| 6,825,529 B2 | 11/2004 | Chidambarrao et al. |
| 6,831,292 B2 | 12/2004 | Currie et al. |
| 6,891,192 B2 | 5/2005 | Chen et al. |
| 6,974,981 B2 | 12/2005 | Chidambarrao et al. |
| 6,977,194 B2 | 12/2005 | Belyansky et al. |
| 7,015,082 B2 | 3/2006 | Doris et al. |
| 2001/0003364 A1 | 6/2001 | Sugawara et al. |
| 2001/0009784 A1 | 7/2001 | Ma et al. |
| 2001/0045604 A1 | 11/2001 | Oda et al. |
| 2002/0063292 A1 | 5/2002 | Armstrong et al. |
| 2002/0074598 A1 | 6/2002 | Doyle et al. |
| 2002/0086472 A1 | 7/2002 | Roberds et al. |
| 2002/0086497 A1 | 7/2002 | Kwok |
| 2002/0090791 A1 | 7/2002 | Doyle et al. |
| 2003/0032261 A1 | 2/2003 | Yeh et al. |
| 2003/0040158 A1 | 2/2003 | Saitoh |
| 2003/0057184 A1 | 3/2003 | Yu et al. |
| 2003/0067035 A1 | 4/2003 | Tews et al. |
| 2003/0087492 A1 | 5/2003 | Lee et al. |
| 2003/0148584 A1 | 8/2003 | Roberds et al. |
| 2004/0188760 A1 | 9/2004 | Skotnicki et al. |
| 2004/0238914 A1 | 12/2004 | Deshpande et al. |
| 2004/0262784 A1 | 12/2004 | Doris et al. |
| 2005/0040460 A1 | 2/2005 | Chidambarrao et al. |
| 2005/0082634 A1 | 4/2005 | Doris et al. |
| 2005/0093030 A1 | 5/2005 | Doris et al. |
| 2005/0098829 A1 | 5/2005 | Doris et al. |
| 2005/0106799 A1 | 5/2005 | Doris et al. |
| 2005/0145954 A1 | 7/2005 | Zhu et al. |
| 2005/0148146 A1 | 7/2005 | Doris et al. |
| 2005/0194699 A1 | 9/2005 | Belyansky et al. |
| 2005/0236668 A1 | 10/2005 | Zhu et al. |
| 2005/0245017 A1 | 11/2005 | Belyansky et al. |
| 2005/0280051 A1 | 12/2005 | Chidambarrao et al. |
| 2005/0282325 A1 | 12/2005 | Belyansky et al. |
| 2006/0027868 A1 | 2/2006 | Doris et al. |
| 2006/0057787 A1 | 3/2006 | Doris et al. |
| 2006/0060925 A1 | 3/2006 | Doris et al. |

FOREIGN PATENT DOCUMENTS

JP      64-76755      3/1989

OTHER PUBLICATIONS

H.S. Momose, et al., "Temperature Dependence of Emitter-Base Reverse Stress Degradation and its Mechanism Analyzed by MOS Structures." 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGe HBTs Following Radiation and Hot-Carrier Stressing." pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application 77 GHz Automotive Radar Systems," 2003, IEEE GaAs Digest, pp. 263-266.

H. Wurzer, et al., "Annealing of Degraded non-Transistors-Mechanisms and Modeling." IEEE Transactions on Electron Devices, vol. 41, No. 4, Apr. 1994, pp. 533-538.

B. Doyle, et al., "Recovery of Hot-Carrier Damage in Reoxidized Nitrided Oxide MOSFETs." IEEE Electron Device Letters, vol. 13, No. 1, Jan. 1992, pp. 38-40.

H.S. Momose, et al. "Analysis of the Temperature Dependence of Hot-Carrier-Induced Degradation in Bipolar Transistors for Bi-CMOS." IEEE Transactions on Electron Devices, vol. 41, No. 6, Jun. 1994, pp. 978-987.

M. Khater, et al., "SiGe HBT Technology with Fmax/Ft=350/300 Ghz and Gate Delay Below 3.3 ps". 2004 IEEE, 4 pages.

J.C. Bean, et al., "GEx SI l-x/Si Strained-Layer Superlattice Grown by Molecular Beam Epitaxy". J. Vac. Sci. Technol. A 2(2), Apr.-Jun. 1984, pp. 436-440.

J.H. Van Der Merwe, "Regular Articles". Journal of Applied Physics, vol. 34, No. 1, Jan. 1963, pp. 117-122.

J.W. Matthews, et al., "Defects in Epitaxial Multilayers". Journal of Crystal Growth 27 (1974), pp. 118-125.

Subramanian S. Iyer, et al. "Heterojunction Bipolar Transistors Using Si-Ge Alloys". IEEE Transactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton, et al., "Equilibrium Critical Thickness for SI1-x GEx Strained Layers on (100) Si". Appl. Phys. Lett. 56 (5), Jan. 29, 1990, pp. 460-462.

Q. Quyang et al., "Two-Dimensional Bandgap Engineering in a Novel Si/SiGe pMOSFET with Enhanced Device Performance and Scalability". 2000, IEEE, pp. 151-154.

Kern Rim, et al., "Transconductance Enhancement in Deep Submicron Strained-Si n-MOSFETS," International Electron Devices Meeting, 26, 8, 1, IEEE, Sep. 1998.

Kern Rim, et al., "Characteristics and Device Design of Sub-100 nm Straing Si N- and PMOSFETS," 2002 Symposium On VLSI Technology Digest of Technical Papers, IEEE, pp. 98-99.

Gregory Scott, et al., "NMOS drive Current Reduction Caused by Transistor Layout and Trench Isolation Induced Stress," International Electron Devices Meeting, 33.4.1, IEEE, Sep. 1999.

F. Ootsuka, et a., "A Highly Dense, High-Performance 130nm node CMOS Technology for Large Scale System-on-a-Chip Application," International Electron Devices Meeting, 23.5.1, IEEE, Apr. 2000.

Shinya Ito, et al., "Mechanical Stress Effect of Etch-Stop Nitride and its Impact on Deep Submicron Transistor Design," International Electron Devices Meeting, 23.5.1, IEEE, Apr. 2000.

A. Shimizu, et al., "Mechanical-Stress Effect of Etch-Stop Nitride and its Impact on Deep Submicron Transistor Design," International Electron Devices Meeting, IEEE, Mar. 2001, pp. 433-436.

K. Ota, et al., "Novel Locally Strained Channel Technique for High Performance 55nm CMOS," International Electron Devices Meeting, 2.2.1, IEEE, Feb. 2002.

Waite, A.M. et al. "Adverse effect of Ge+ Implementation for fabrication of SIGe PMOS", Electronics Letters, Dec. 6, 2001, vol. 37, No. 25.

European Search Report for EP 04810466.5, dated Jun. 6, 2008.

* cited by examiner

US 7,429,752 B2

METHOD AND STRUCTURE FOR FORMING STRAINED SI FOR CMOS DEVICES

CROSS-REFERENCE TO RELATED APPLICATIONS

The present application is a continuation of parent U.S. patent application Ser. No. 10/605,906, filed on Nov. 5, 2003, now U.S. Pat. No. 7,129,126, the disclosure of which is expressly incorporated by reference herein in its entirety.

BACKGROUND OF INVENTION

The invention generally relates to methods for manufacturing a semiconductor device with improved device performance, and more particularly to methods for manufacturing semiconductor devices which impose tensile and compressive stresses in the substrate of the device during device fabrication.

Generally, metal-oxide semiconductor transistors include a substrate made of a semiconductor material, such as silicon. The transistors typically include a source region, a channel region and a drain region within the substrate. The channel region is located between the source and the drain regions. A gate stack, which usually includes a conductive material, a gate oxide layer and sidewall spacers, is generally provided above the channel region. More particularly, the gate oxide layer is typically provided on the substrate over the channel region, while the gate conductor is usually provided above the gate oxide layer. The sidewall spacers help protect the sidewalls of the gate conductor.

It is known that the amount of current flowing through a channel which has a given electric field across it, is generally directly proportional to the mobility of the carriers in the channel. Thus, by increasing the mobility of the carriers in the channel, the operation speed of the transistor can be increased.

It is further known that mechanical stresses within a semiconductor device substrate can modulate device performance by, for example, increasing the mobility of the carriers in the semiconductor device. That is, stresses within a semiconductor device are known to enhance semiconductor device characteristics. Thus, to improve the characteristics of a semiconductor device, tensile and/or compressive stresses are created in the channel of the n-type devices (e.g., NFETs) and/or p-type devices (e.g., PFETs). However, the same stress component, for example tensile stress or compressive stress, improves the device characteristics of one type of device (i.e., n-type device or p-type device) while discriminatively affecting the characteristics of the other type device.

In order to maximize the performance of both NFETs and PFETs within integrated circuit (IC) devices, the stress components should be engineered and applied differently for NFETs and PFETs. That is, because the type of stress which is beneficial for the performance of an NFET is generally disadvantageous for the performance of the PFET. More particularly, when a device is in tension (in the direction of current flow in a planar device), the performance characteristics of the NFET are enhanced while the performance characteristics of the PFET are diminished. To selectively create tensile stress in an NFET and compressive stress in a PFET, distinctive processes and different combinations of materials are used.

For example, a trench isolation structure has been proposed for forming the appropriate stresses in the NFETs and PFETs, respectively. When this method is used, the isolation region for the NFET device contains a first isolation material which applies a first type of mechanical stress on the NFET device in a longitudinal direction (parallel to the direction of current flow) and in a transverse direction (perpendicular to the direction of current flow). Further, a first isolation region and a second isolation region are provided for the PFET and each of the isolation regions of the PFET device applies a unique mechanical stress on the PFET device in the transverse and longitudinal directions.

Alternatively, liners on gate sidewalls have been proposed to selectively induce the appropriate strain in the channels of the FET devices (see Ootsuka et al., IEDM 2000, p. 575, for example). By providing liners the appropriate stress is applied closer to the device that the stress applies as a result of the trench isolation fill technique.

While these methods do provide structures that have tensile stresses being applied to the NFET device and the compressive stresses being applied along the longitudinal direction of the PFET device, they may require additional materials and/or more complex processing, and thus, resulting in higher cost. Further, the level of stress that can be applied in these situations is typically moderate (i.e., on the order of 100s of MPa). Thus, it is desired to provide more cost-effective and simplified methods for creating large tensile and compressive stresses in the channels NFETs and PFETs, respectively.

SUMMARY OF INVENTION

In a first aspect of the invention, the invention provides a method for manufacturing a device including an n-type device and a p-type device. The method involves doping a portion of a semiconductor substrate and forming a gap in the semiconductor substrate by removing at least a portion of the doped portion of the semiconductor substrate. The method further involves growing a strain layer in at least a portion of the gap in the semiconductor substrate.

In aspects of the invention, for the n-type device, the strain layer is grown on at least a portion which is substantially directly under a channel of the n-type device. For the p-type device, the strain layer is grown on at least a portion which is substantially directly under a source region or drain region of the p-type device and not substantially under a channel of the p-type device.

In another aspect of the invention, the invention provides a method for manufacturing a device including an n-type device and a p-type device. The method involves growing a strain layer on a semiconductor substrate and growing a silicon layer above the strain layer. A gap is formed between the semiconductor substrate and the silicon layer by removing at least a portion of the silicon layer and the strain layer from above the semiconductor substrate and a strain layer is grown in at least a portion of the gap. For the n-type device, the strain layer is grown on at least a portion which is substantially directly under a channel of the n-type device. For the p-type device, the strain layer is grown on at least a portion which is substantially directly under a source region or drain region of the p-type device and not substantially under a channel of the p-type device.

This invention separately provides a semiconductor device which has a semiconductor substrate having at least one gap, the gap extending under a portion of the semiconductor substrate. The device includes a gate stack on the semiconductor substrate and a strain layer formed in at least a portion of the gap, where the gap is formed by doping a portion of the semiconductor substrate and etching the doped portions of the semiconductor substrate.

In another aspect of the invention, the invention provides a semiconductor device which has a semiconductor substrate having at least one gap, the gap extending under a portion of the semiconductor substrate. The device includes a gate stack on the semiconductor substrate and a strain layer formed only under at least a portion of a source region and a drain region of the semiconductor substrate.

DETAILED DESCRIPTION

Figure 1:
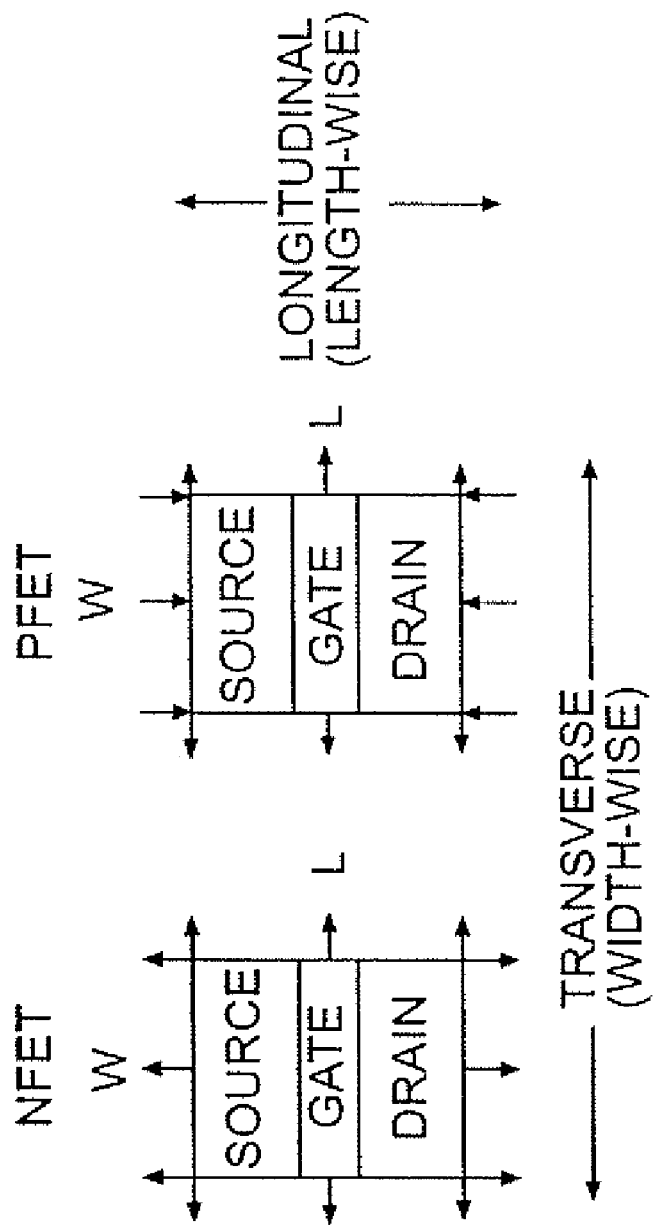
FIG. 1 illustrates desired stress states for PFETs and NFETs.

The invention provides a method for fabricating devices with improved performance characteristics. When a stress layer, such as, a SiGe layer, a $Si_3N_4$ layer, a $SiO_2$ layer or a $SiO_xN_y$ layer is grown epitaxially on a silicon layer, compressive forces form within the SiGe layer and tensile forces form in the silicon layer. In an aspect of the invention, the silicon substrate has a gap in which a strain layer is grown. The gap includes a tunnel-like portion which is between an upper portion of the semiconductor substrate and a lower portion of the semiconductor substrate. More particularly, the upper portion has a lower surface and the lower portion face has an upper surface and the lower surface of the upper portion faces the upper surface of the lower portion. By having a strain layer substantially below a channel and/or a strain layer in a region of the semiconductor substrate substantially below a source region and/or a drain region of the semiconductor device stresses are formed in the channel of the transistor. In an aspect of the invention, the gap in the silicon substrate is formed by selectively etching the silicon substrate and then epitaxially growing SiGe on the silicon substrate.

Tensile and/or compressive stresses can be provided in the channel of a transistor depending on the proximity of the grown SiGe to the channel of the transistor. By selectively etching the silicon layer below a transistor and selectively growing SiGe on the etched portion of the silicon layer, tensile stresses can be provided in the channel of NFETs and compressive stresses can be provided in the channel of PFETs. Further, by implementing the stresses by selectively etching a portion of the silicon below a transistor prior to growing SiGe, this invention provides stress levels in the silicon under the gate (e.g., the channel region) which are much larger than the isolation-based or liner-based approaches.

In this invention, a stress layer, such as a SiGe layer, for example, is used to form stresses in a channel of the semiconductor device. When a SiGe layer is grown on a semiconductor layer the surrounding semiconductor material is subjected to tensile stress while the grown SiGe layer is subjected to compressive stress. In particular, a portion of the semiconductor device is put under tensile stress and the SiGe layer is subjected to compressive stress because the SiGe layer has a different lattice structure than the silicon layer. Further, the stress levels resulting from the SiGe stress layer are relatively high (on the order of 1-2 GPa).

However, as discussed above, tensile stresses in the channel area are beneficial to the NFET drive currents while compressive stresses in the channel area are beneficial to the PFET drive currents. In particular, tensile stresses significantly hinder the PFET drive currents. In this invention, the stresses in the PFET are made to be compressive stresses rather than tensile stresses in order to improve the performance of the PFET. Thus, this invention provides a method for providing longitudinal compressive stresses along the channel of the PFET while providing tensile stresses along the channel of the NFET to improve the performance of the devices.

FIG. 1 illustrates desired stress states for improving the performance of PFETs and NFETs (see Wang et al., IEEE Tran. Electron Dev., v. 50, p. 529, 2003). In FIG. 1, an NFET and a PFET are shown to have a source region, a gate region and a drain region. The NFET and PFET are shown to have arrows extending outward from the active area to illustrate tensile stresses. The arrows extending inward toward the PFET device are illustrative of compressive forces. More specifically, the outwardly extending arrows, shown extending from the NFET, illustrate a tensile stress that is desired in the transverse and longitudinal directions of the device. On the other hand, the inwardly extending arrows, shown with relation to the PFET, illustrate a desired longitudinal compressive stress.

The range of stresses needed to influence device drive currents is of the order of a few hundred MPa to a few GPa. The width and the length of the active area of each device are represented by "W" and "L", respectively. It should be understood that each of the longitudinal or transverse stress components could be individually tailored to provide the performance enhancements for both devices (i.e., the NFET and the PFET).

Figure 2A:
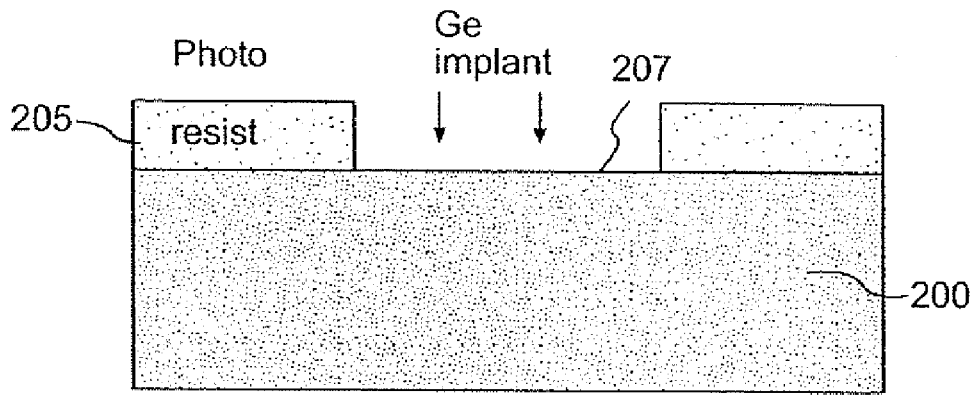
FIGS. 2(a) through 2(j) illustrate an exemplary process for forming a n-type transistor according to the invention.

FIGS. 2(a) through 2(j) depict an exemplary process for forming n-type devices according to this invention. As shown in FIG. 2(a), a patterned photo-resist layer 205 is deposited over a silicon substrate 200 and the exposed portion of the silicon substrate 200 is doped, for example, with Ge, As, B, In or Sb. For example, the doping concentration of Ge may be, for example, about $1\times10^{14}$ Ge/cm2 to about $1\times10^{16}$ Ge/cm2. A doped region 207 is formed in the semiconductor substrate 200.

Figure 2B:
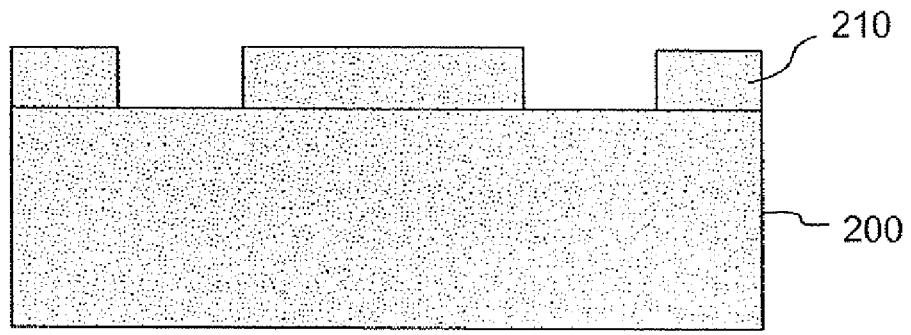

Then, as shown in FIG. 2(b), the patterned photo-resist layer 205 is removed and a mask 210, made of nitride, for example, is deposited on the surface of the semiconductor substrate 200. The mask 210 protects the semiconductor substrate beneath it from being etched during reactive ion etching (RIE). Generally, the mask 210 exposes portions of the semiconductor substrate where shallow trenches are to be formed via RIE.

Figure 2C:
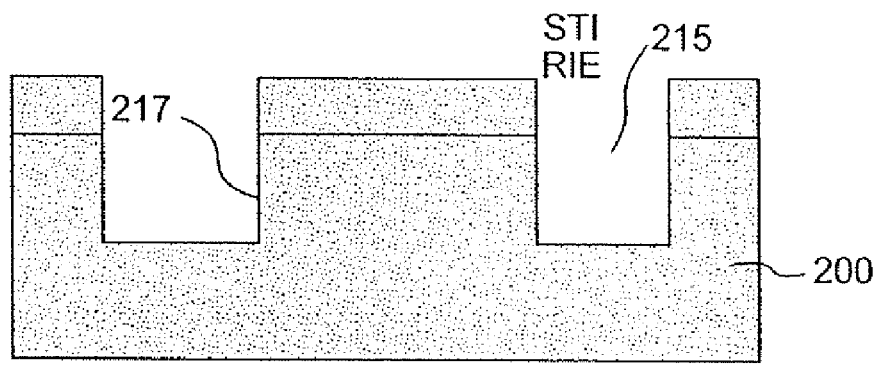

As shown in FIG. 2(c), RIE is performed to form grooves/trenches 215 in the semiconductor substrate 200. As a result of the RIE step, side-wall portions 217 of the doped semiconductor region are formed. In particular, the location of the formed grooves/trenches at least partially overlaps a portion of the doped semiconductor region 207 such that when the grooves/trenches 215 are formed, the doped semiconductor substrate region is exposed. Further, as will be discussed below, after a strain layer is formed, oxide material is deposited to fill the trenches, such that devices adjacent to each other on the semiconductor substrate 200 are electrically isolated from each other.

After the grooves/trenches 215 are formed, wet etching and/or dry etching is performed to selectively remove the doped semiconductor 207. Generally, the depth of the trench will be about 1000 Angstroms to about 5000 Angstroms from the upper surface 231 (FIG. 2(f) of the semiconductor substrate and the thickness of a channel region of a transistor is typically about 30 Angstroms to about 200 Angstroms.

Figure 2D:
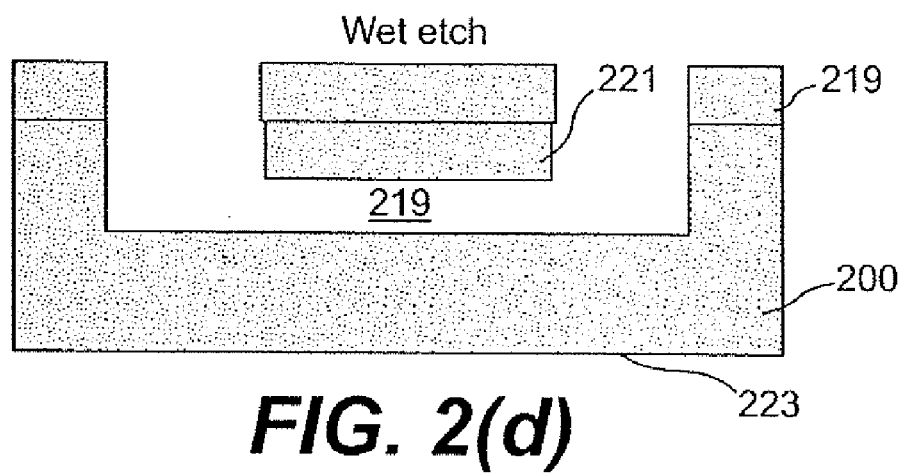

As shown in FIG. 2(d), etching may be performed until a tunnel-like gap 219 is formed between an upper portion 221 of the semiconductor substrate 200 and a lower portion 223 of the semiconductor substrate 200. Typically, a portion having a depth of about 300 Angstroms to about 5000 Angstroms is etched from the semiconductor substrate 200. In the case of an n-type transistor it is desired to form the strain layer substantially directly and/or directly under the channel of the device. Thus, for n-type transistors there is at least a gap under the channel of the device.

Figure 2E:
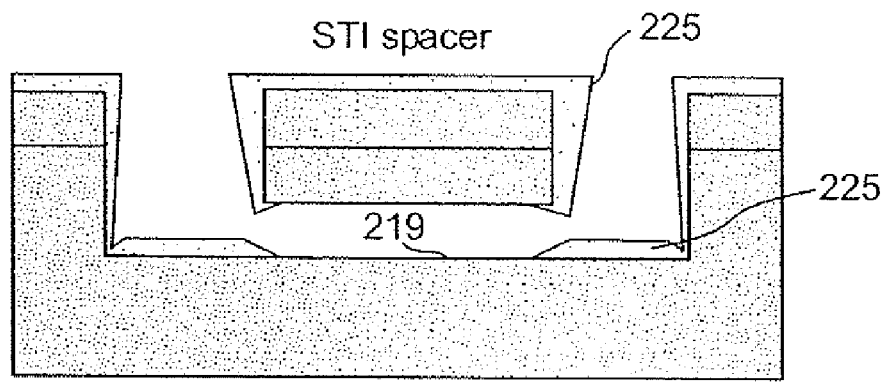

Next, as shown in FIG. 2(e), a spacer material 225 is deposited over the semiconductor substrate 200. The spacer material may be, for example, a non-conformal film such as, silicon carbide SiC, oxynitride or a film stack, such as, an oxide film and a nitride film. This spacer material 225 is formed on the exposed portions of the semiconductor substrate 200 other than the portion of the semiconductor substrate below the upper portion 221.

Figure 2F:
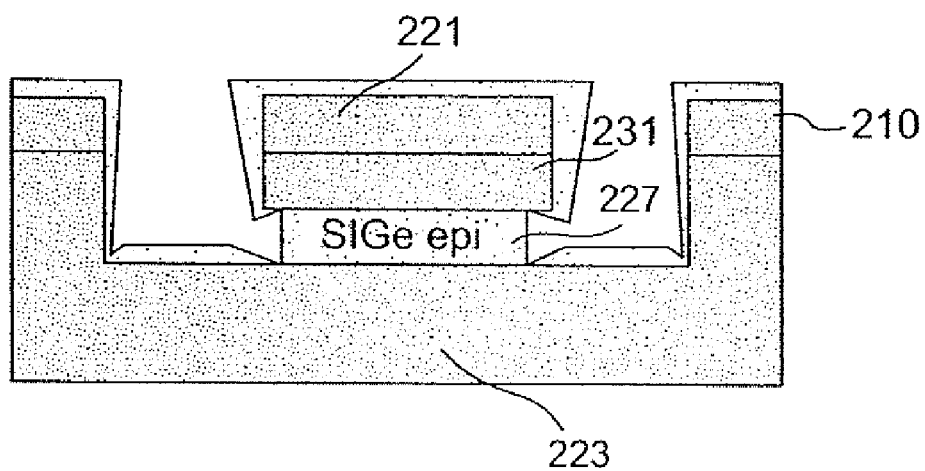

As shown in FIG. 2(f), a strain layer 227 is epitaxially grown in the tunnel-like gap 219 of the semiconductor substrate 200. As shown in FIG. 2(f), the strain layer 227 is generally formed between an upper portion 221 and a lower portion 223 of the semiconductor substrate 200, where the upper portion 221 of the semiconductor substrate 200 is part of the original semiconductor substrate (i.e., was not removed/disturbed and deposited). That is, the strain layer 227 is generally formed via selective deposition such that the strain layer 227 is formed on the exposed surfaces of the semiconductor substrate 200.

Further, because the strain layer 227 is formed in a tunnel-like gap, the upper surface 231 of the upper portion 221 is undisturbed (i.e., original) and substantially flat.

The strain layer may be, for example, silicon germanium or silicon carbide. It should be understood that the strain layer may be made of any known appropriate material.

Figure 2G:
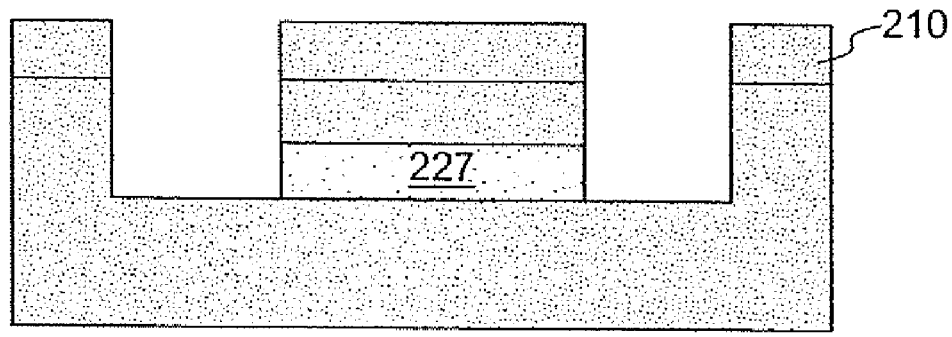
Figure 2H:
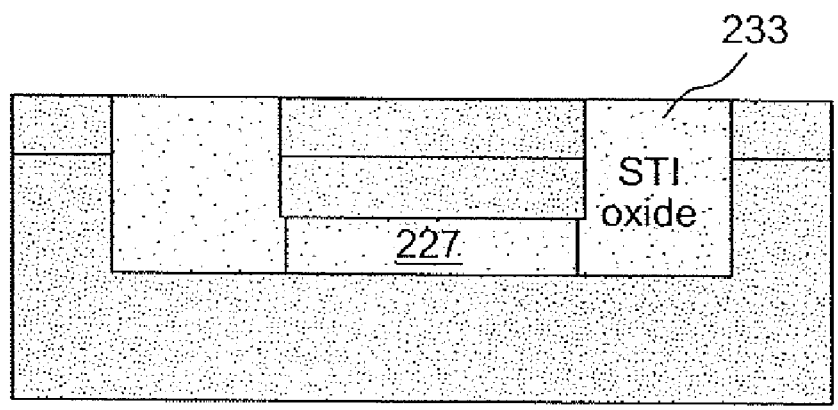

After the strain layer 227 is formed, the spacer material 225 is removed using wet chemicals. It should be understood that any known applicable method may be used to remove the spacer material 225. The resulting device without the spacer material is shown in FIG. 2(g).

As discussed above, and as shown in FIG. 2(h), oxide material 233 is then deposited to fill the trenches and electrically isolate the device from any adjacent device. After filling the trenches with the oxide material, the mask 210 is removed using any known appropriate method. After the mask 210 is removed, chemical mechanical polishing (CMP) is performed to substantially planarize the upper surface 231 of the semiconductor substrate 200.

Figure 2I:
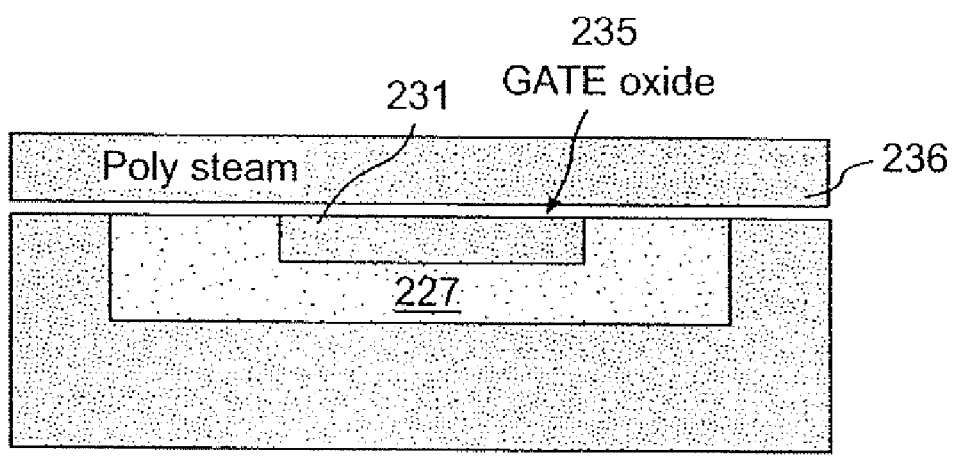

Next, the semiconductor device is further fabricated using known methods. For example, as shown in FIG. 2(I), a gate oxide layer 235 is grown on the upper surface 231 of the semiconductor substrate 200. A gate oxide layer 235 of about 10 Angstroms to about 100 Å is generally grown. On the gate oxide layer 235, a polysilicon layer 236 is generally deposited using chemical vapor deposition (CVD) to a thickness of about 500 Angstoms to about 1500 Angstoms to form the gate electrode 237. Patterned photoresist layers (not shown) are used to define the gate electrodes. A thin layer of oxide (not oxide) is then grown on the remaining polysilicon. Patterned photoresist layers (not shown), which are later removed, are used to successively tip (and halo countering doping implants) implant the n-type and p-type transistors. For n-type transistors, a very shallow and low dose implant of arsenic ions, for example, may be used to form the p-tip (while a Boron implant, for example, may be used for halos). For p-type transistors, (discussed below with regards to FIGS. 3(a) 3(d)), a very shallow and low dose implant of $BF_2$ ions, for example, may be used to form n-tip (while an arsenic implant may, for example, be used for halos).

Figure 2J:
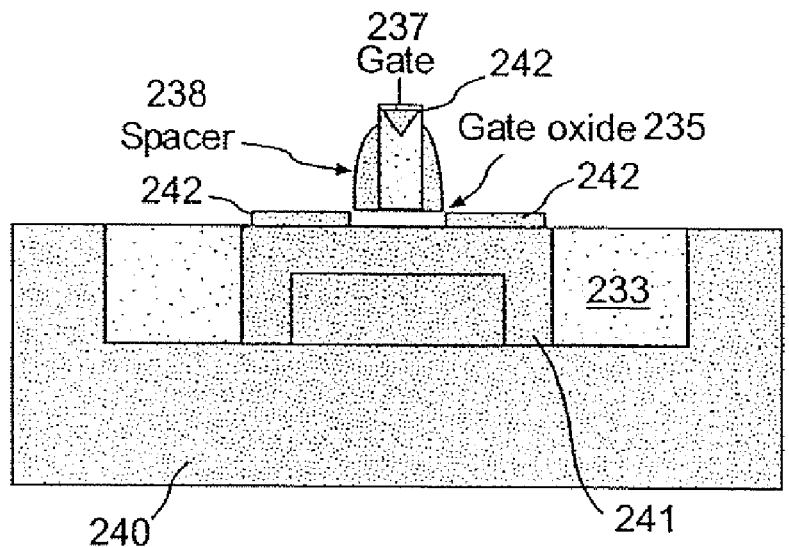

Next, as shown in FIG. 2(j), spacers 238 may be are formed by depositing a silicon nitride layer (not shown) using CVD to a thickness of about 100 Angstoms to about 1000 Angstoms and then etching the nitride from the regions other than the sidewalls of the gate. The combination of the gate oxide layer 235, gate electrode 237 and spacers 238 may be referred to as a gate stack.

Patterned photoresist layers (not shown), which are removed prior to the next stage of the process, are used to successively create the source/drain regions of the transistors. For the n-type transistors, a shallow and high-dose of arsenic ions, for example, may be used to form the source/drain regions 240 and 241 while the p-type transistors are covered with the corresponding photoresist layer. As discussed above, in the methods according to this invention, the source and drain regions 240 and 241 are formed in upper portions of semiconductor substrate 200 (i.e., not removed and reformed). For the p-type transistors, (discussed below with regards to FIGS. 3(a)-3(d)), a shallow and high dose of $BF_2$ ions, for example, may be used to form the source/drain regions 340 and 341 while the n-type transistors are covered with the corresponding photoresist layer. An anneal is then used to activate the implants. The exposed oxide on the structure is then stripped by dipping the structure in HF in order to expose bare silicon in the source, gate and drain regions of the transistors.

Still referring to FIG. 2(j), metal is deposited to a thickness of about 30 Angstroms to about 200 Angstroms across the wafer surface in order to form silicide 242. The suicide could be formed from reacting the underlying with any deposited metal such as Co, Hf, Mo, Ni, Pd2, Pt, Ta, Ti, W, and Zr. In the regions, such as, the source, drain and gate regions, where the deposited metal is in contact with silicon, the deposited metal reacts with the silicon to form silicide. Next, the structure is heated to temperature of about 300° C. to about 1000° C. to allow the deposited silicide material to react with the exposed polysilicon or silicon. During sintering, silicide only forms in the regions where metal is in direct contact with silicon or polysilicon. In the other regions (i.e., where the deposited metal is not in contact with silicon), the deposited metal remains unchanged. This process aligns the silicide to the exposed silicon and is called "self-aligned silicide" or salicide. The unreacted metal is then removed using a wet etch while the formed suicide remains.

In the methods according to this invention because the source and drain regions of the semiconductor device are formed on portions of the semiconductor substrate which are undisturbed (i.e., not etched and re-formed), the surface is more favorable to cobalt silicide formation as cobalt silicide. Further, generally an oxide fill (not shown) followed by chemical mechanical polishing is used to planarize the surface. The fabrication processes continues as necessary according to the design specifications.

FIGS. 3(a) through 3(d) depict an exemplary process for forming p-type devices according to this invention. The process for forming p-type devices is similar to the process for forming n-type devices, as discussed above with regards to FIGS. 2(a) 2(j) and thus, the following discussion will primarily focus on the differences between the two process. The details of the method for forming a p-type device which are not discussed below, may be found in the above description of the method for forming an n-type device.

Figure 3A:
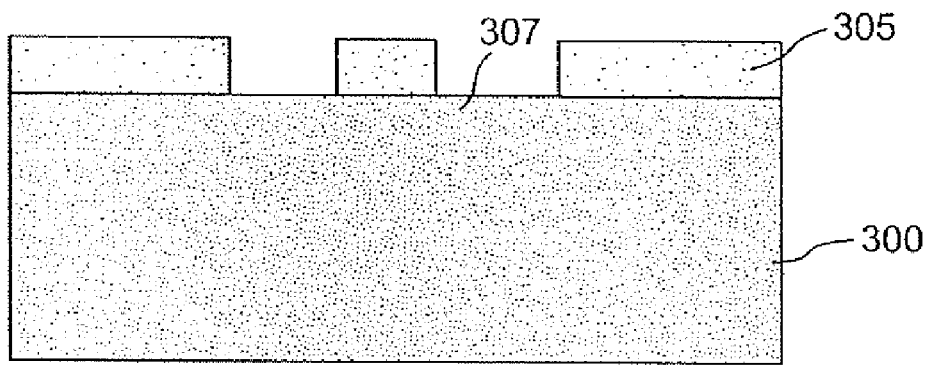
FIGS. 3(a) through 3(d) illustrate an exemplary process for forming an p-type transistor according to the invention.
Figure 3B:
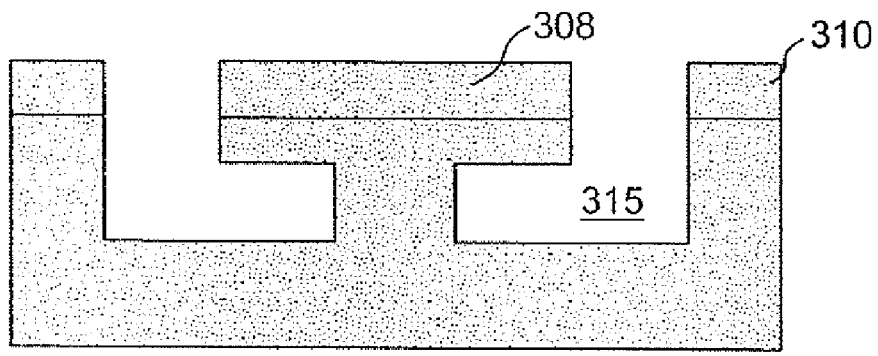

As shown in FIG. 3(a), a patterned photo-resist layer 305 is deposited. For the p-type devices, the portion 307 of the semiconductor substrate 300 which will be below the channel of the semiconductor device is also covered with the patterned photo-resist layer 305. Thus, for the p-type devices, as shown in FIG. 3(b), when the doped region of the semiconductor substrate is selectively etched to form the gap 315, a portion 308 of the semiconductor substrate 300 remains. After the structure is formed, this portion 308 of the semiconductor substrate is substantially directly under the channel of the semiconductor device.

Figure 3C:
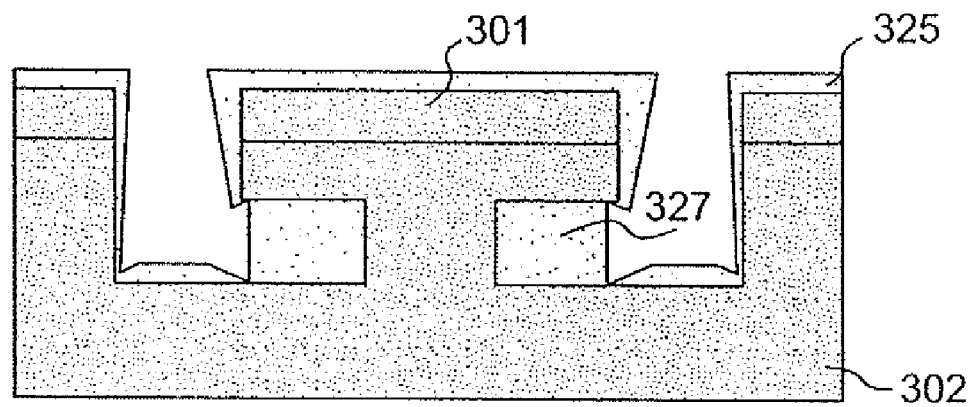
Figure 3D:
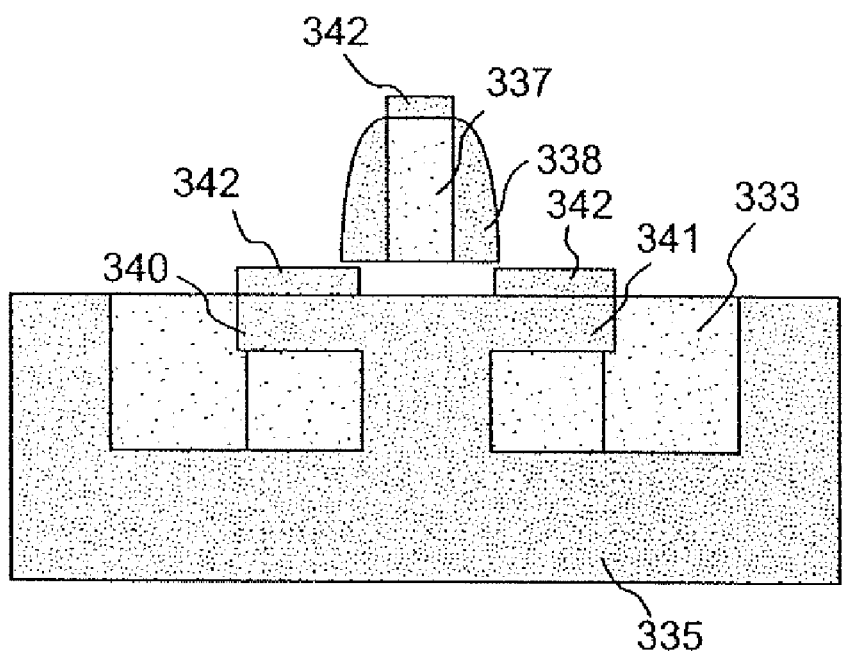

Next, as shown in FIG. 3(c), a strain layer 327 is grown in the gap between the remaining upper portion 301 and lower portion 302 of the semiconductor substrate 300. Then, as shown in FIG. 3(d), oxide material is deposited to fill the gaps/trenches 315. Similar to the process for forming n-type devices, gate oxide 335 is deposited on the upper surface of the semiconductor substrate and the gate electrode 337, spacers 338, source/drain regions 340 and 341 and silicide contacts 342 are formed.

Figure 4:
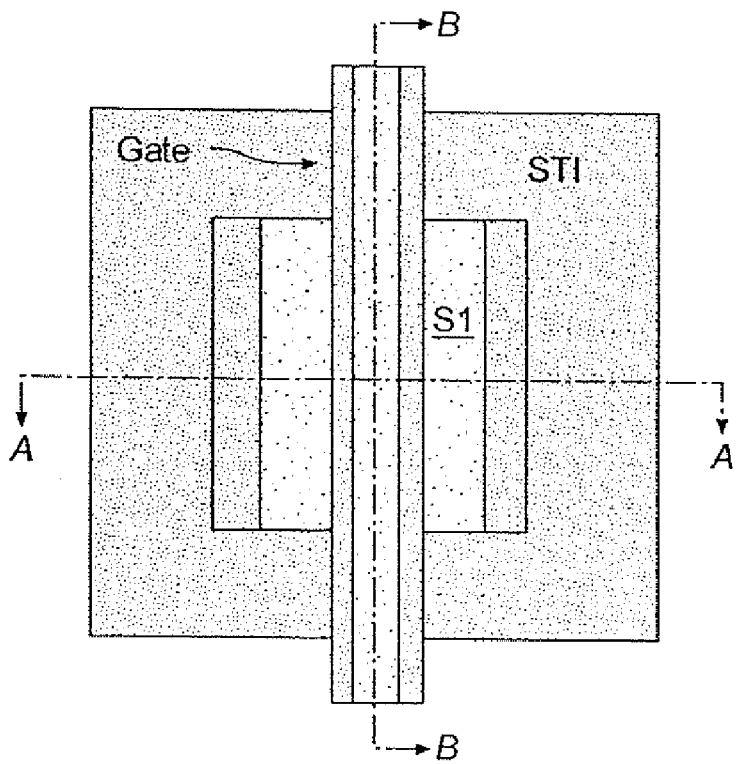
FIG. 4 illustrates a top-down view of a transistor according to the invention.

FIG. 4 depicts a top-down view of a transistor according to the invention. A cross-sectional view taken along line A-A of FIG. 4 is the structure shown in FIG. 2(I) and a cross-sectional view taken along line B-B of FIG. 4 is the structure shown in FIG. 2(j). As shown in FIG. 4, the gate electrode 237 with the spacer 238 is located above the semiconductor substrate 200. The oxide fill 233 (i.e., shallow trench isolation structure) isolates the source and drain regions 240 and 241 of the semiconductor substrate 200.

Figure 5:
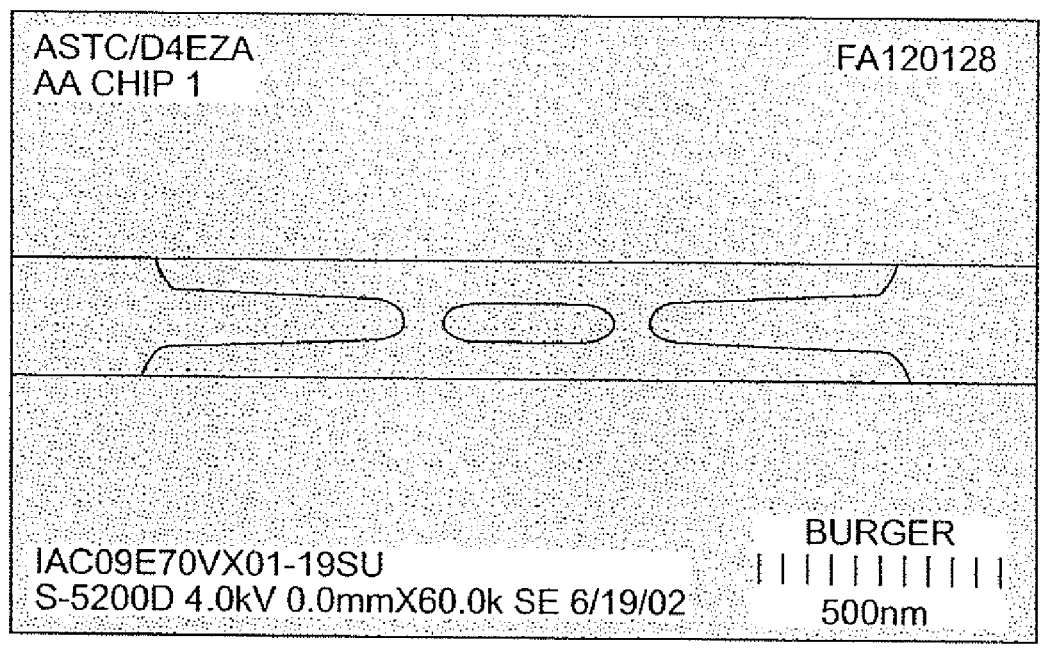
FIG. 5 shows a cross-section of a semiconductor substrate according to the invention using a scanning electron microscope.

FIG. 5 shows a cross-section of a semiconductor substrate according to the invention. The representation of the semiconductor substrate shown in FIG. 5 was obtained using a scanning electron microscope. In particular, FIG. 5 shows the silicon substrate after the doped silicon has been selectively removed to form tunnel-like gaps 219 in the semiconductor substrate. As shown in FIG. 5, a lower surface of an upper portion of the semiconductor substrate and an upper surface of a lower portion of the semiconductor substrate define a portion of the gap in the semiconductor substrate. The gap in the semiconductor substrate may include an opening along an upper surface of the semiconductor substrate.

In another embodiment of the methods according to this invention, instead of selectively doping the semiconductor substrate with Ge, for example, such that selective portions of the semiconductor substrate may be removed via etching, it is possible to grow a layer, such as, a SiGe layer, on the semiconductor substrate, followed by a silicon epitaxial layer, for example. Then, similar to the doping method described above, sidewalls of the SiGe may be exposed and then selectively etched to form the gaps in the semiconductor substrate.

As discussed above with regards to FIG. 1 in PFETs, a longitudinal compressive stress is desired. The typical range for the desired compressive/tensile stresses is on the order of a few hundred MPa to a few GPa. For example, stresses of about 100 MPa to about 2 or 3 GPa are generally desired. The invention can produce very high compressive stresses and tensile stresses in the channels of the PFET and NFET devices, respectively.

By providing tensile stresses to the channel of the NFET and compressive stresses to the channel of the PFET the charge mobility along the channels of each device is enhanced. Thus, as described above, the invention provides a method for providing compressive stresses along the longitudinal direction of the channel by providing a strain layer either substantially directly under the channel of the semiconductor device or substantially directly under the source and/or drain region of the semiconductor device. This invention also provides a method for optimizing the stress level in the transistor channel by adjusting the location and/depth of the gap where the strain layer is formed.

While the invention has been described in terms of embodiments, those skilled in the art will recognize that the invention can be practiced with modification within the spirit and scope of the appended claims.

What is claimed:

1. A semiconductor device, comprising:
a semiconductor substrate having at least one gap, extending under a portion of the semiconductor substrate;
a gate stack on the semiconductor substrate; and
a strain layer formed in at least a portion of the at least one gap,
wherein the strain layer is formed only under at least one of a source region and a drain region of the semiconductor device.

2. The device of claim 1, wherein the semiconductor device is a p-type device.

3. The device of claim 1, wherein the strain layer is made of at least one of silicon germanium or silicon carbide.

4. The device of claim 1, wherein the strain layer is between a surface of an upper portion of the semiconductor substrate which faces a surface of a lower portion of the semiconductor substrate.

5. The device of claim 1, wherein the strain layer has a thickness of about 1000 Angstroms to about 5000 Angstroms.

6. The device of claim 5, wherein the semiconductor device comprises a channel and a thickness of the channel is about 30 Angstroms to about 200 Angstroms.

7. The device of claim 1, wherein the strain layer is formed under both the source region and the drain region of the semiconductor device.

8. The device of claim 1, wherein the gap has a first width along an upper surface of the semiconductor substrate and a second width below the upper surface of the semiconductor substrate and the second width is larger than the first width.

9. The device of claim 1, wherein the semiconductor device comprises a channel and compressive stresses of about 100 MPa to about 3 GPa exist within the channel of the semiconductor device.

10. The device of claim 1, wherein the strain layer is at least one of SiGe, $Si_3N_4$, $SiO_2$ and $SiO_xN_y$.

11. The device of claim 1, wherein the at least one gap is a tunnel gap.

12. The device of claim 1, wherein the strain layer is formed between upper and lower portions of the semiconductor substrate.

13. A semiconductor device, comprising:
a semiconductor substrate;
a strain layer arranged in a gap formed in the semiconductor substrate such that at least a portion of the semiconductor substrate extends over the gap; and
one of:
a gate stack formed on the semiconductor substrate after the strain layer is arranged in the gap; and
source and drain regions formed in upper portions of the semiconductor substrate after the strain layer is arranged in the gap,
wherein the strain layer is formed only under the source region.

14. A semiconductor device, comprising:
a semiconductor substrate;
a strain layer arranged in a gap formed in the semiconductor substrate such that at least a portion of the semiconductor substrate extends over the gap; and
one of:
 a gate stack formed on the semiconductor substrate after the strain layer is arranged in the gap; and
 source and drain regions formed in upper portions of the semiconductor substrate after the strain layer is arranged in the gap, wherein the strain layer is formed only under the drain region.

* * * * *